United States Patent
Galler et al.

(10) Patent No.: US 10,677,668 B2
(45) Date of Patent: Jun. 9, 2020

(54) PRESSURE SENSOR AND METHOD FOR MEASURING A PRESSURE

(71) Applicants: Robert Bosch GmbH, Gerlingen-Schillerho (DE); TDK Electronics AG, München (DE)

(72) Inventors: Martin Galler, Kalsdorf (AT); Harald Kastl, Bad Gams (AT); Markus Puff, Graz (AT)

(73) Assignees: ROBERT BOSCH GMBH, Gerlingen-Schillerho (DE); TDK ELECTRONICS AG, München (DE)

( * ) Notice: Subject to any disclaimer, the term of this patent is extended or adjusted under 35 U.S.C. 154(b) by 0 days.

(21) Appl. No.: 15/767,071

(22) PCT Filed: Sep. 1, 2016

(86) PCT No.: PCT/EP2016/070644
§ 371 (c)(1),
(2) Date: Apr. 9, 2018

(87) PCT Pub. No.: WO2017/060012
PCT Pub. Date: Apr. 13, 2017

(65) Prior Publication Data
US 2018/0299334 A1 Oct. 18, 2018

(30) Foreign Application Priority Data
Oct. 8, 2015 (DE) .................. 10 2015 117 203

(51) Int. Cl.
*G01L 1/16* (2006.01)
*G01L 5/00* (2006.01)
(Continued)

(52) U.S. Cl.
CPC .............. *G01L 1/16* (2013.01); *G01L 5/0038* (2013.01); *G01L 9/08* (2013.01); *H01L 41/0477* (2013.01);
(Continued)

(58) Field of Classification Search
CPC . G01L 1/16; G01L 5/0038; G01L 9/08; H01L 41/0477; H01L 41/083; H01L 41/1132; H01L 41/1876
(Continued)

(56) References Cited

U.S. PATENT DOCUMENTS

| 4,346,041 A | 8/1982 | Aristoff |
| 8,410,663 B2 * | 4/2013 | Sakamoto ........... H01L 41/0838 310/328 |

(Continued)

FOREIGN PATENT DOCUMENTS

| CN | 1856887 A | 11/2006 |
| CN | 102290526 A | 12/2011 |

(Continued)

OTHER PUBLICATIONS

Schöner, A., "Melltechnik," Heidelberg: Springer, 1994, 8 pages.

*Primary Examiner* — Max H Noori
(74) *Attorney, Agent, or Firm* — Slater Matsil, LLP

(57) ABSTRACT

A pressure sensor and a method for measuring a pressure, the pressure sensor including a main body having a piezoelectric material and at least two internal electrodes arranged in the piezoelectric material, where the at least two internal electrodes are arranged such that a voltage arises between the at least two internal electrodes when a pressure acts on a side surface of the main body.

14 Claims, 2 Drawing Sheets

(51) Int. Cl.
 *H01L 41/113* (2006.01)
 *H01L 41/047* (2006.01)
 *H01L 41/083* (2006.01)
 *H01L 41/187* (2006.01)
 *G01L 9/08* (2006.01)
 *G01L 1/00* (2006.01)

(52) U.S. Cl.
 CPC ........ H01L 41/083 (2013.01); H01L 41/1132 (2013.01); H01L 41/1876 (2013.01)

(58) Field of Classification Search
 USPC ...................................................... 73/862.68
 See application file for complete search history.

(56) References Cited

U.S. PATENT DOCUMENTS

| | | | |
|---|---|---|---|
| 9,252,351 B2 | 2/2016 | Gabl | |
| 10,018,521 B2* | 7/2018 | Hall | ............ G01L 1/16 |
| 2003/0115966 A1 | 6/2003 | Ueno et al. | |
| 2004/0185278 A1* | 9/2004 | Sato | ............ H01G 2/20 428/469 |
| 2006/0232172 A1* | 10/2006 | Asano | ............. H01L 41/0472 310/366 |
| 2006/0273687 A1* | 12/2006 | Fujimoto | ............. H03H 3/08 310/313 R |
| 2007/0069610 A1* | 3/2007 | Ono | ............. H01L 41/083 310/328 |
| 2008/0238264 A1* | 10/2008 | Nakamura | .......... H01L 41/0472 310/364 |
| 2010/0078505 A1 | 4/2010 | Kato | |
| 2010/0320284 A1 | 12/2010 | Okamura | |
| 2013/0221807 A1* | 8/2013 | Shimizu | ............. H01L 41/0471 310/366 |

FOREIGN PATENT DOCUMENTS

| | | |
|---|---|---|
| CN | 102790168 A | 11/2012 |
| DE | 102006001134 A1 | 7/2007 |
| DE | 102010055934 A1 | 6/2012 |
| EP | 2124268 A1 | 11/2009 |
| JP | S57142530 A | 9/1982 |
| JP | H04346041 A | 12/1992 |
| JP | 2002214030 A | 7/2002 |
| JP | 2002333373 A | 11/2002 |
| JP | 2012112824 A | 6/2012 |
| JP | 2015175811 A | 10/2015 |
| WO | 2008066098 A1 | 6/2008 |
| WO | 2015115279 A1 | 8/2015 |

* cited by examiner

- Prior art -

PRESSURE SENSOR AND METHOD FOR MEASURING A PRESSURE

This patent application is a national phase filing under section 371 of PCT/EP2016/070644, filed Sep. 1, 2016, which claims the priority of German patent application 10 2015 117 203.8, filed Oct. 8, 2015, each of which is incorporated herein by reference in its entirety.

TECHNICAL FIELD

The present invention relates to a pressure sensor and a method for measuring a pressure.

BACKGROUND

Pressure sensors based on piezoelectric materials, such as a lead zirconate titanate (PZT) ceramic or quartz, for example, are known. FIG. 1 shows such a monolithic piezoelectric pressure sensor 101. The latter comprises a monolithic main body 102, which consists of a homogeneous layer of a pressure-sensitive material. External electrodes 105, 108 are respectively arranged on an upper side surface 109 and a lower side surface no of the main body 102, such that the layer of the pressure-sensitive material is situated between the external electrodes 105, 108. The external electrodes 105, 108 serve for tapping off the electrical signal that arises in the event of pressure loading.

In the case of the sensor 101, the pressure to be measured acts directly on the external electrodes 105, 108. Numerous disadvantages are associated with this. The external electrodes 105, 108 have to be covered with insulation layers in order to prevent leakage currents from arising. Moreover, electrical connections of the external electrodes 105, 108 furthermore have to be provided on the upper and lower side surfaces 106, 107, such that the surfaces 106, 107 cannot be used over the whole area for the pressure loading. The external electrodes 105, 108 comprise a metallic material, which with tenable outlay is only able to be manufactured with an inadequate flatness. The unevenness on the surfaces 106, 107 can lead to measurement inaccuracies. Moreover, under constantly occurring alternating pressure loads, the metallic external electrodes 105, 108 exhibit high wear effects that can shorten the lifetime of the pressure sensor 101.

SUMMARY OF THE INVENTION

Embodiments of the invention provide an improved pressure sensor which makes it possible to overcome at least one of the disadvantages mentioned above. Further embodiments provide an improved method for measuring a pressure.

The pressure sensor may measure a pressure, or a mechanical stress, with the aid of the piezoelectric effect. The pressure acting on the pressure sensor may be converted into an electrical charge flow. This property can be employed to measure pressures or pressure fluctuations.

In embodiments the pressure sensor includes a main body, wherein the main body comprises a piezoelectric material and at least two internal electrodes arranged in the piezoelectric material. In this case, the at least two internal electrodes are arranged in the piezoelectric material in such a way that a voltage arises between the at least two internal electrodes if a pressure acts on a side surface of the main body that is provided for an application of pressure.

In various further embodiments, the internal electrodes can be referred to as "arranged in the piezoelectric material" if they are arranged between two layers of the piezoelectric material. Accordingly, a top side and an underside of each internal electrode can be covered by the piezoelectric material. In contrast, a lateral surface bearing against an external electrode can be free of the piezoelectric material.

In various other embodiments, the side surface of the main body that is provided for the application of pressure is, in particular, a side surface of the main body that is arranged parallel to the internal electrodes. The main body can also comprise a plurality of side surfaces provided for the application of pressure.

The pressure sensor can comprise an arbitrary number of internal electrodes. In particular, the pressure sensor can comprise more than two internal electrodes. The internal electrodes can be divided into first internal electrodes contacted with a first external electrode, and second internal electrodes contacted with a second external electrode, wherein the number of first and second internal electrodes need not be identical.

The pressure sensor comprising internal electrodes arranged in the piezoelectric material can make it possible to overcome the disadvantages described above. The side surface provided for the application of pressure can consist of the piezoelectric material. Under constant alternating pressure loading, the piezoelectric material can have a significantly higher loading capacity than a metallic material, such that the lifetime of the pressure sensor is increased. Furthermore, the piezoelectric material can be manufactured with a high degree of flatness, such that the side surface provided for the application of pressure is free of unevenness and no measurement errors can result therefrom.

A further advantage of the pressure sensor is its improved design freedom. The output signal generated by the pressure sensor can be influenced in a desired manner by means of a variation in the number of internal electrodes. What can be achieved in this case, in particular, is that the current intensity of said signal or the voltage of said signal is increased.

The pressure sensor can further comprise a first external electrode and a second external electrode. Each of the at least two internal electrodes can be connected to the first external electrode or the second external electrode. The first external electrode can be arranged on a first side surface of the main body. The second external electrode can be arranged on a second side surface of the main body. Neither the first side surface nor the second side surface can be provided for the application of pressure. Accordingly, they differ from the side surface provided for the application of pressure and are arranged in particular perpendicularly to said side surface. The first and second side surfaces can be situated opposite one another.

The first external electrode can be arranged perpendicularly to the at least two internal electrodes. The second external electrode can be arranged perpendicularly to the at least two internal electrodes.

In various embodiments, since the pressure acts in a direction perpendicular to the internal electrodes, the pressure exerts only a minimal force on the external electrodes, which likewise extend in this direction.

The side surface of the main body that is provided for an application of pressure can be arranged parallel to the at least two internal electrodes. Accordingly, the pressure preferably exerts a maximum force on said side surface.

The pressure sensor can furthermore comprise an evaluation unit connected to the at least two internal electrodes, said evaluation unit being configured to determine the pressure acting on the main body. In this case, the at least two internal electrodes can be electrically contacted with one another via the evaluation unit, wherein the evaluation unit is configured to measure a current flowing between the at least two internal electrodes and to determine therefrom the pressure acting on the main body. Alternatively, the evaluation unit can also be configured to measure a voltage present between the at least two internal electrodes and to determine therefrom the pressure acting on the main body.

Depending on the configuration of the evaluation unit, the pressure sensor can be configured in such a way that the current intensity or the voltage of an electrical signal generated owing to a pressure acting on the main body is particularly high. A high voltage arises in the case of a small number of internal electrodes. A high current intensity arises in the case of a large number of internal electrodes.

The piezoelectric main body can comprise a lead zirconate titanate ceramic. Alternatively, the piezoelectric main body can comprise some other piezoelectric material, for example, a piezoelectric quartz. The internal electrodes can comprise silver, silver-palladium or copper or can consist of one of these materials.

The first and second external electrodes can comprise or consist of a partial vitreous firing metallization composed of silver, silver-palladium or copper. The first and second external electrodes can furthermore comprise a sputtering layer composed of CuAg or CrNiAg.

Embodiments of the present invention relates to a method for measuring a pressure.

In various embodiments, a method for measuring a pressure by a pressure sensor is proposed, wherein the pressure sensor comprises a main body comprising a piezoelectric material, at least two internal electrodes arranged in the piezoelectric material, a first external electrode and a second external electrode, wherein each of the at least two internal electrodes is connected to the first external electrode or the second external electrode, wherein the first external electrode is arranged on a first side surface of the main body, wherein the second external electrode is arranged on a second side surface of the main body, and wherein the main body furthermore comprises a third side surface, which is free of the first external electrode and the second external electrode. In the method, the pressure to be measured is exerted on the third side surface.

In particular, the pressure sensor described above can be used for the method in accordance with the aspect discussed here. Accordingly, all structural and functional features disclosed for the pressure sensor can also apply to the method.

In various further embodiments, the pressure to be measured is exerted on a side surface of the main body that is free of electrodes. Various advantages can be achieved as a result. The third side surface provided for the application of pressure can consist of the piezoelectric material. Under constant alternating pressure loading, the piezoelectric material can have a significantly higher loading capacity than a metallic material, such that the lifetime of the pressure sensor is increased. Furthermore, the piezoelectric material can be manufactured with a high degree of flatness, such that the side surface provided for the application of pressure is free of unevenness and no measurement errors can result therefrom.

Furthermore, a voltage can arise between the at least two internal electrodes owing to the pressure exerted on the third side surface, wherein the pressure sensor can furthermore comprise an evaluation unit connected to the at least two internal electrodes. The method can comprise the step of determining the pressure acting on the main body on the basis of a current intensity measured by the evaluation unit or on the basis of a voltage measured by the evaluation unit.

BRIEF DESCRIPTION OF THE DRAWINGS

The present invention is described in greater detail below with reference to the figures.

DETAILED DESCRIPTION OF ILLUSTRATIVE EMBODIMENTS

Figure 2:
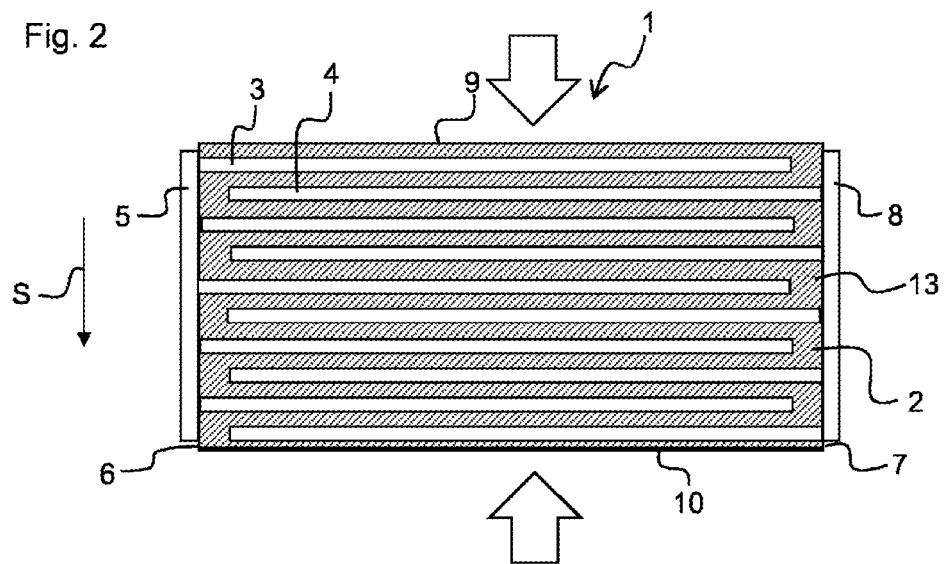
FIG. 2 shows a first exemplary embodiment of a pressure sensor.

FIG. 2 shows a pressure sensor 1 in accordance with a first exemplary embodiment. The pressure sensor 1 comprises a main body 2 comprising a piezoelectric material 13. First internal electrodes 3 and second internal electrodes 4 are arranged in the main body 2. In this case, the internal electrodes 3,4 are respectively arranged between layers of the piezoelectric material 13.

The first internal electrodes 3 are electrically contacted with a first external electrode 5. The first external electrode 5 is arranged on a first side surface 6 of the main body 2. The first side surface 6 of the main body 2 and also the first external electrode 5 are in this case perpendicular to the internal electrodes 3, 4. Furthermore, the first internal electrodes 3 are set back relative to a second outer surface 7 situated opposite the first side surface 6. A second external electrode 8 is arranged on the second side surface 7. The first internal electrodes 3 are not electrically contacted with the second external electrode 8.

The second internal electrodes 4 are electrically contacted with the second external electrode 8. The second internal electrodes 4 are set back relative to the first side surface 6 and are accordingly not electrically connected to the first external electrode 5.

First internal electrodes 3 and second internal electrodes 4 alternate in a stacking direction S that is perpendicular to the internal electrodes 3, 4, wherein a layer consisting of the piezoelectric material 13 is respectively arranged between two internal electrodes 3, 4.

The main body 2 furthermore comprises at least one side surface 9, 10 that is provided for an application of pressure. The direction from which the pressure acts on the main body 2 is marked by two corresponding arrows in FIG. 1. The side surface 9, 10 provided for the application of pressure extends parallel to the internal electrodes 3,4. In the case of the pressure sensor 1 shown in FIG. 1, an upper side surface 9 and a lower side surface 10 are provided for the application of pressure.

If a pressure then acts on the side surfaces 9, 10 provided for the application of pressure, said pressure acts on the piezoelectric material 13 of the main body 2. On account of the piezoelectric effect, the polarization of the piezoelectric material 13 is thereby changed under the action of the pressure. This is associated with an accumulation of electrical charge that arises in the piezoelectric material 13 and can be conducted away via the internal electrodes 3, 4. The greater the pressure acting on the pressure sensor 1, the more charge is generated in the main body 2 and conducted away via the internal electrodes 3, 4 to the respective external electrodes 5, 8.

The relationship between the electric field generated in the main body 2 and the pressure exerted on the main body 2 is described by the two equations (1) and (2):

$$s = d_{33}E + S_{33}T \qquad (1)$$

$$D = \varepsilon_{33}\varepsilon_o E + d_{33}T \qquad (2)$$

In this case, s indicates the mechanical strain of the main body 2, D indicates the displacement density, E indicates the electric field strength of the electric field that arises owing to the piezoelectric effect, T indicates the mechanical stress acting on the main body, d indicates the piezo constant of the piezoelectric material 13 of the main body 2, $\varepsilon_{33}$ and $\varepsilon_o$ indicate the relative permitivities and $s_{33}$ indicates the compliance. It is furthermore assumed in equations (1) and (2) that the pressure axis, the polarization axis and the detection axis each correspond and lie in the stacking direction S, which here is also referred to as the 33-direction.

If the electric field generated is then measured, the pressure acting on the main body 2 can be calculated therefrom. In order to measure said field, either a voltage present at the external electrodes 5,8 or a current intensity of a current that flows upon the short-circuiting of the external electrodes 5,8 can be measured.

Figure 3:
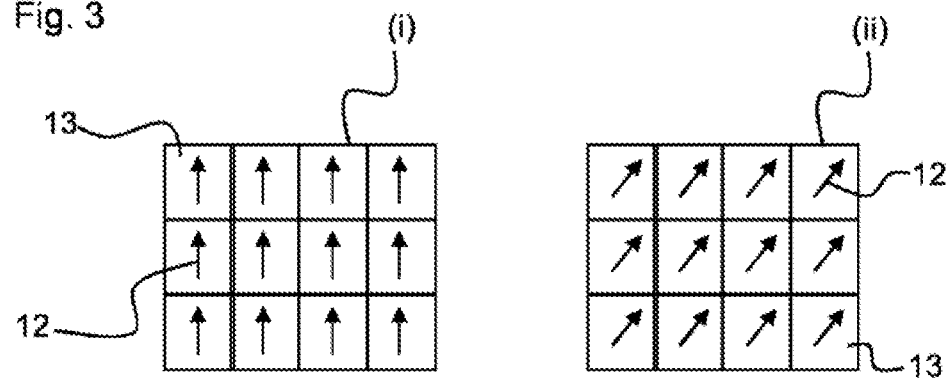
FIG. 3 shows, in a schematic illustration, the variation of the polarization of a piezoelectric material under the action of pressure.

FIG. 3 indicates that the polarization direction 12 of the piezoelectric material 13 changes under the action of a pressure. Excerpt i shows the polarization without the action of a pressure and excerpt ii shows the polarization with pressure acting.

Figure 4:
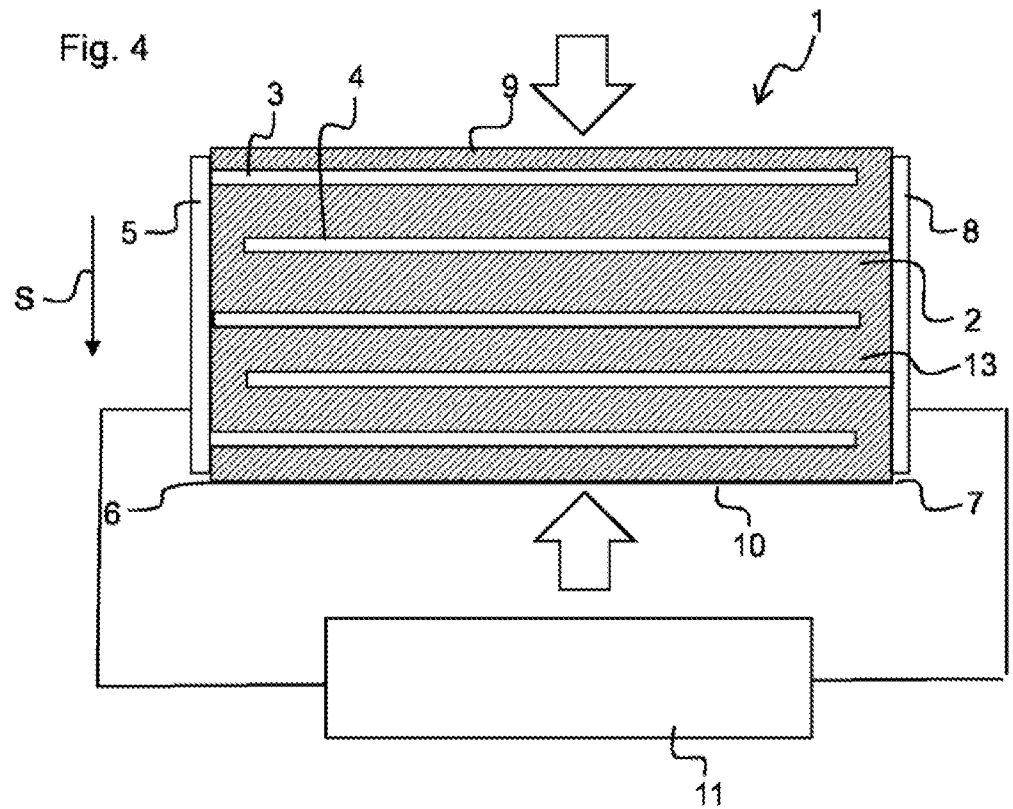
FIG. 4 shows a second exemplary embodiment of a pressure sensor.

FIG. 4 shows a possible set-up for pressure measurement with the aid of the pressure sensor 1, wherein a pressure sensor 1 in accordance with a second exemplary embodiment is used here. The pressure sensor 1 in accordance with the second exemplary embodiment differs from the pressure sensor 1 in accordance with the first exemplary embodiment in terms of the number of first and second internal electrodes 3, 4.

Furthermore, the pressure sensor 1 is connected to an electronic evaluation unit 11. In accordance with the exemplary embodiment shown in FIG. 4, the first external electrode 5 and the second external electrode 8 are electrically contacted with one another via the electronic evaluation unit 11. Accordingly, upon the action of a pressure on the main body 2, a current flows from the first external electrode 5 via the evaluation unit 11 to the second external electrode 8. The evaluation unit 11 is configured to measure the current intensity of said current. The pressure acting on the main body 2 can be calculated from this measurement variable.

In accordance with an alternative exemplary embodiment, the first external electrode 5 and the second external electrode 8 are not short-circuited with one another via the electronic evaluation unit 11. In this case, the evaluation unit 11 can determine a voltage present between the two external electrodes 5, 8 and calculate the pressure acting on the main body 2 from this measurement variable.

Figure 1:
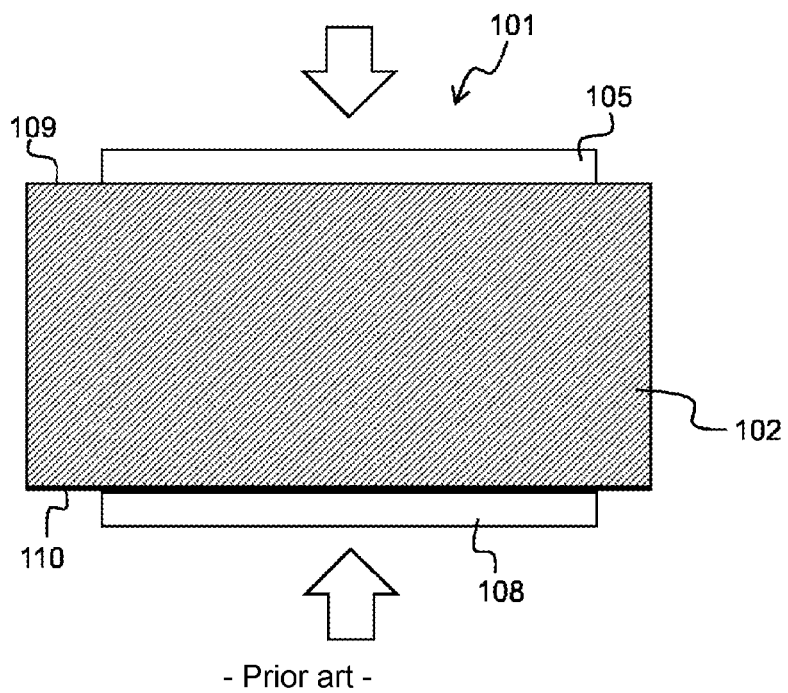
FIG. 1 shows a monolithic pressure sensor that is known in the prior art.

The pressure sensors 1 comprising internal electrodes 3, 4 arranged in the main body 2 as described here have considerable advantages over the monolithic pressure sensors 101 shown in FIG. 1. In particular, the pressure sensors 1 are configured in such a way that the pressure loading does not act on the side surface 6, 7 on which the external electrodes 5, 8 are situated. The side surfaces 9, 10 provided for the application of pressure consist of an electrically insulating piezoelectric material 13. Therefore, an additional insulation layer is not required in order to avoid leakage currents. Furthermore, no electrical contacting takes place on the surfaces to which pressure is applied, such that said surfaces can be loaded by the pressure for the whole area. By contrast, if external electrodes were provided on the side surfaces to be acted on, then a part of the surface would have to be used for the electrical contacting of the external electrodes.

Since the side surface provided for the application of pressure consists of a piezoelectric material 13, it can be manufactured with a high degree of flatness, which can result in a high measurement accuracy, in particular. Surfaces composed of a piezoelectric material 13 can be manufactured with lower outlay with a higher degree of flatness than would be possible for metallic surfaces. Furthermore, the piezoelectric materials 13 prove to be very durable vis-à-vis alternating pressure loads, such that a side surface consisting of a piezoelectric material 13 can increase the lifetime of the pressure sensor 1.

A further advantage of the pressure sensor described here consists in the high design freedom thereof. By virtue of the fact that the number of internal electrodes can be varied in a desired manner, the output charge conducted away via the internal electrodes and/or the voltage present between the internal electrodes can be set in a desired manner. The relationship between these variables is described by formulae (3) to (5).

$$Q_n = n \cdot Q_o \qquad (3)$$

$$U_n = U_o/n \qquad (4)$$

$$E_n = (Q_n \cdot U_n)/2 = (Q_o \cdot U_o)/2 = E_o \qquad (5)$$

In this case, n indicates the number of piezoelectric layers. $Q_n$ indicates the charge output of the pressure sensor 1 comprising n piezoelectric layers. $Q_o$ indicates the charge output of a monolithic pressure sensor 101 without integrated internal electrodes and with the same volume. $U_n$ indicates the open-circuit voltage of the pressure sensor 1 comprising n piezoelectric layers that is present between the external electrodes 5, 8 if the external electrodes 5, 8 are not short-circuited with one another. $U_o$ indicates the open-circuit voltage between the external electrodes 105, 108 of the corresponding monolithic pressure sensor 101. $E_n$ indicates the output energy of the sensor 1 comprising n piezoelectric layers, which is proportional to the product of open-circuit voltage and charge output. $E_o$ indicates the output energy of the monolithic sensor 101.

Formulae (3) to (5) show that the output energy $E_n$ is independent of the number of internal electrodes 3, 4. By contrast, the output voltage $Q_n$ is inversely proportional to the number of internal electrodes 3, 4. The charge output $Q_n$, which substantially determines the current intensity of an electrical signal when the two external electrodes 5, 8 are connected, is directly proportional to the number of internal electrodes. For an evaluation unit 11 in which measurements are intended to be performed on the basis of the current intensity of the output current, a pressure sensor 1 comprising many internal electrodes 3, 4 is therefore advantageous since a higher output current intensity is achieved here, as a result of which the sensitivity of the sensor 1 can be increased. For a sensor 1 in which the evaluation unit 11 measures on the basis of the output voltage, by contrast, a sensor 1 having a small number of internal electrodes 3, 4 is advantageous since a maximum sensitivity can be achieved in this way.

The invention claimed is:

1. A pressure sensor comprising:
a main body comprising:
a piezoelectric material; and
at least two internal electrodes arranged in the piezoelectric material, wherein the at least two internal electrodes are arranged such that a voltage arises between the at least two internal electrodes when a pressure acts on a side surface of the main body that is provided for an application of pressure, and wherein a polarization direction of the piezoelectric material changes under action of the pressure;
wherein the pressure sensor is configured to calculate a mechanical stress T acting on the main body based on equations (1) and (2):

$$s=d33E+s33T \qquad (1)$$

$$D=\epsilon33 \ \epsilon0E+d33T \qquad (2),$$

wherein s indicates a mechanical strain of the main body, D indicates a displacement density, E indicates an electrical field strength of an electrical field that arises owing to a piezoelectric effect, d indicates a piezo constant of the piezoelectric material of the main body, ε33 and ε0 indicate relative permittivities and s33 indicates compliance, and wherein it is assumed that a pressure axis, a polarization axis and a detection axis each correspond and lie in a stacking direction.

2. The pressure sensor according to claim 1, wherein the side surface of the main body that is provided for the application of pressure consists of the piezoelectric material.

3. The pressure sensor according to claim 1, further comprising:
a first external electrode arranged on a first side surface of the main body; and
a second external electrode arranged on a second side surface of the main body,
each of the at least two internal electrodes connecting to the first external electrode or the second external electrode, and
wherein neither the first side surface nor the second side surface is the side surface that is provided for the application of pressure.

4. The pressure sensor according to claim 3, wherein the first external electrode is arranged perpendicularly to the at least two internal electrodes, and wherein the second external electrode is arranged perpendicularly to the at least two internal electrodes.

5. The pressure sensor according to claim 4, wherein the first and second external electrodes comprise a partial vitreous firing metallization composed of silver, silver-palladium or copper.

6. The pressure sensor according to claim 4, wherein the first and second external electrodes comprise a sputtering layer composed of CuAg or CrNiAg.

7. The pressure sensor according to claim 1, wherein the side surface of the main body that is provided for the application of the pressure is arranged parallel to the at least two internal electrodes.

8. The pressure sensor according to claim 1, further comprising an evaluation unit connected to the at least two internal electrodes, the evaluation unit being configured to determine the pressure acting on the main body.

9. The pressure sensor according to claim 8, wherein the at least two internal electrodes are electrically contacted with one another via the evaluation unit, and wherein the evaluation unit is configured to measure a current flowing between the at least two internal electrodes and to determine therefrom the pressure acting on the main body.

10. The pressure sensor according to claim 8, wherein the evaluation unit is configured to measure a voltage present between the at least two internal electrodes and to determine therefrom the pressure acting on the main body.

11. The pressure sensor according to claim 1, wherein the piezoelectric material comprises a lead zirconate titanate ceramic.

12. The pressure sensor according to claim 1, wherein the internal electrodes comprise silver, silver-palladium or copper.

13. A method for measuring a pressure with a pressure sensor, wherein the pressure sensor comprises a main body comprising a piezoelectric material, at least two internal electrodes arranged in the piezoelectric material, a first external electrode and a second external electrode, wherein each of the at least two internal electrodes is connected to the first external electrode or the second external electrode, wherein the first external electrode is arranged on a first side surface of the main body, wherein the second external electrode is arranged on a second side surface of the main body, and wherein the main body further comprises a third side surface, which is free of the first external electrode and the second external electrode, the method comprising:
measuring the pressure on the third side surface, wherein a polarization direction of the piezoelectric material changes under action of the pressure;
wherein a mechanical stress T acting on the main body is calculated based on equations (1) and (2):

$$s=d33E+s33T \qquad (1)$$

$$D=\epsilon33 \ \epsilon0E+d33T \qquad (2),$$

wherein s indicates a mechanical strain of the main body, D indicates a displacement density, E indicates an electrical field strength of an electrical field that arises owing to a piezoelectric effect, d indicates a piezo constant of the piezoelectric material of the main body, ε33 and ε0 indicate relative permittivities and s33 indicates compliance, and wherein it is assumed that a pressure axis, a polarization axis and a detection axis each correspond and lie in a stacking direction.

14. The method according to claim 13, wherein the pressure sensor further comprises an evaluation unit connected to the at least two internal electrodes, and wherein the method further comprises:
generating a voltage between the at least two internal electrodes based on the pressure detected on the third side surface;
measuring a current intensity or the voltage by the evaluation unit; and
determining the pressure acting on the main body based on the current intensity or the voltage.

* * * * *